(12) United States Patent
Chang et al.

(10) Patent No.: US 9,379,080 B2
(45) Date of Patent: Jun. 28, 2016

(54) METHOD AND APPARATUS FOR A CONDUCTIVE PILLAR STRUCTURE

(71) Applicant: Taiwan Semiconductor Manufacturing Company, Ltd., Hsin-Chu (TW)

(72) Inventors: Jung-Hua Chang, Hsin-Chu (TW); Cheng-Lin Huang, Hsin-Chu (TW); Nai-Wei Liu, Fengshan (TW); Jui-Pin Hung, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/657,893

(22) Filed: Mar. 13, 2015

(65) Prior Publication Data

US 2015/0187724 A1  Jul. 2, 2015

Related U.S. Application Data

(63) Continuation of application No. 13/795,081, filed on Mar. 12, 2013, now Pat. No. 8,994,171.

(51) Int. Cl.
*H01L 21/44* (2006.01)
*H01L 29/40* (2006.01)
(Continued)

(52) U.S. Cl.
CPC ............ *H01L 24/17* (2013.01); *H01L 23/3171* (2013.01); *H01L 23/3192* (2013.01); *H01L 24/03* (2013.01); *H01L 24/05* (2013.01);
(Continued)

(58) Field of Classification Search
CPC ......... H01L 24/14; H01L 24/15; H01L 24/17; H01L 2224/02462; H01L 2224/03464; H01L 2924/00; H01L 2224/05611; H01L 2224/0524; H01L 2224/05647; H01L 2224/0401; H01L 24/06; H01L 2224/0555; H01L 2224/0556; H01L 2224/05111; H01L 2224/05571
USPC .......... 438/612–617; 257/737, 738, E23.021, 257/E23.069, E23.068
See application file for complete search history.

(56) References Cited

U.S. PATENT DOCUMENTS

| | | | |
|---|---|---|---|
| 5,912,510 | A | 6/1999 | Hwang et al. |
| 6,515,361 | B2 | 2/2003 | Lee et al. |

(Continued)

FOREIGN PATENT DOCUMENTS

| | | |
|---|---|---|
| RW | 201244042 | 11/2012 |
| TW | 200725658 | 7/2007 |

(Continued)

*Primary Examiner* — Jasmine Clark
(74) *Attorney, Agent, or Firm* — Slater Matsil, LLP

(57) ABSTRACT

A method and apparatus for a conductive pillar structure is provided. A device may be provided, which may include a substrate, a first passivation layer formed over the substrate, a conductive interconnect extending through the first passivation layer and into the substrate, a conductive pad formed over the first passivation layer, and a second passivation layer formed over the interconnect pad and the second passivation layer. A portion of the interconnect pad may be exposed from the second passivation layer. The conductive pillar may be formed directly over the interconnect pad using one or more electroless plating processes. The conductive pillar may have a first and a second width and a first height corresponding to a distance between the first width and the second width.

20 Claims, 4 Drawing Sheets

(51) Int. Cl.
*H01L 23/00* (2006.01)
*H01L 23/31* (2006.01)

(52) U.S. Cl.
CPC ............... *H01L24/06* (2013.01); *H01L 24/11*
(2013.01); *H01L 2224/0312* (2013.01); *H01L 2224/0384* (2013.01); *H01L 2224/0391* (2013.01); *H01L 2224/03462* (2013.01); *H01L 2224/03464* (2013.01); *H01L 2224/0401* (2013.01); *H01L 2224/05022* (2013.01); *H01L 2224/05111* (2013.01); *H01L 2224/05124* (2013.01); *H01L 2224/05144* (2013.01); *H01L 2224/05147* (2013.01); *H01L 2224/05184* (2013.01); *H01L 2224/05556* (2013.01); *H01L 2224/05571* (2013.01); *H01L 2224/05573* (2013.01); *H01L 2224/05611* (2013.01); *H01L 2224/05624* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/1112* (2013.01); *H01L 2224/13017* (2013.01); *H01L 2924/0105* (2013.01); *H01L 2924/01013* (2013.01); *H01L 2924/01022* (2013.01); *H01L 2924/01029* (2013.01); *H01L 2924/01046* (2013.01); *H01L 2924/01078* (2013.01); *H01L 2924/15787* (2013.01)

(56) References Cited

U.S. PATENT DOCUMENTS

| | | | |
|---|---|---|---|
| 7,253,520 | B2 | 8/2007 | Yoshida et al. |
| 7,834,462 | B2 | 11/2010 | Dobritz et al. |
| 2007/0013065 | A1 | 1/2007 | Yuzawa et al. |
| 2007/0096313 | A1* | 5/2007 | Chou ............... H01L 23/5329 257/737 |
| 2007/0141800 | A1 | 6/2007 | Kurihara et al. |
| 2009/0057922 | A1 | 3/2009 | Lee et al. |
| 2012/0018851 | A1 | 1/2012 | Farooq et al. |
| 2012/0056315 | A1 | 3/2012 | Chang et al. |
| 2012/0273939 | A1 | 11/2012 | Dai et al. |
| 2013/0285257 | A1 | 10/2013 | Lee et al. |
| 2013/0341785 | A1 | 12/2013 | Fu et al. |
| 2014/0264838 | A1 | 9/2014 | Chang et al. |

FOREIGN PATENT DOCUMENTS

| | | |
|---|---|---|
| TW | 200917394 | 4/2009 |
| TW | 201109670 | 3/2011 |
| TW | 201209963 | 3/2012 |

* cited by examiner

METHOD AND APPARATUS FOR A CONDUCTIVE PILLAR STRUCTURE

CROSS REFERENCE TO RELATED APPLICATIONS

The present application claims priority to and is a continuation of U.S. patent application Ser. No. 13/795,081, filed on Mar. 12, 2013, now U.S. Pat. No. 8,994,171, and entitled "Method and Apparatus for a Conductive Pillar Structure," which application is incorporated herein by reference. The present application is related to U.S. patent application Ser. No. 13/889,053, entitled "Method and Apparatus for a Conductive Bump Structure," filed on Mar. 12, 2013, now U.S. Pat. No. 8,847,389, commonly assigned to the assignee of the present application, which application is hereby incorporated by reference herein.

BACKGROUND

In a semiconductor manufacturing process, multiple semiconductor dies may be manufactured concurrently with each other by forming dies at the same time on a semiconductor wafer. The semiconductor dies may contain multiple devices such as transistors, resistors, capacitors, inductors, and the like, using, e.g., a combination of implantation, deposition, masking, etching, annealing, and passivating steps during the manufacturing process. Once formed, these devices may be connected to each other to form functional units and/or circuits using alternating layers of metallization and dielectric layers.

Conductive pillars may be formed on semiconductor dies to provide connection to the devices within the semiconductor dies. The individual semiconductor dies may be singulated from the wafer. The semiconductor dies may be integrated as part of a larger system or integrated circuit such as a three-dimensional integrated circuit ("3DIC"), which may be formed by stacking and interconnecting dies on top of each other. The conductive pillars may be used to provide interconnection to other semiconductor dies or to provide connection to additional metallization, dielectric layers, and/or conductive bumps that can be formed over one or more dies in a semiconductor package.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

Figure 1:
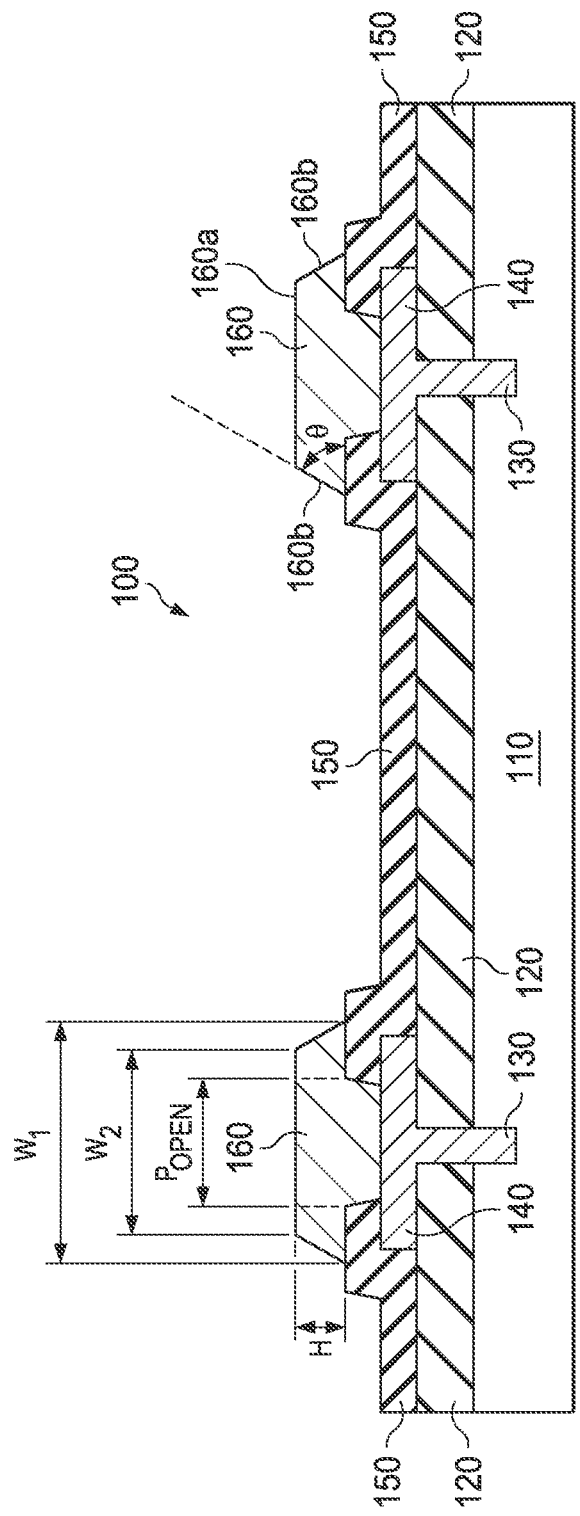
FIG. 1 illustrates a cross-sectional view of a device according to an embodiment.

FIG. 1 illustrates a cross-sectional view of a device 100 formed according to an embodiment. As illustrated in FIG. 1, the device 100 may include a substrate 110, a first passivation layer 120, one or more conductive interconnects 130, one or more conductive interconnect pads 140, a second passivation layer 150 and one or more conductive pillars 160. A pair of conductive pillars 160 is shown in FIG. 1 for illustrative purposes only and is not meant to limit the scope of the present embodiments. Each of the conductive pillar(s) 160, corresponding interconnect pad(s) 140 and corresponding interconnect(s) 130 may provide electrical connection to redistribution layers ("RDLs"), electrical devices and/or circuits (all not shown) that may be formed within the substrate 110. The interconnect(s) 130 may extend through the first passivation layer 120 and into the substrate 110 to connect to such layers and/or devices (not shown).

The conductive pillar(s) 160 may be formed using one or more electroless plating processes. Forming the conductive pillar(s) 160 using one or more electroless plating processes may decrease the overall manufacturing cost and lead time for forming the conductive pillars as compared to previous pillar forming techniques. For example, previous techniques for forming pillars utilized multi-step processes that included the depositing or sputtering of an intermediate under bump metallization ("UBM") layer on an interconnect pad; the forming and patterning of a photoresist layers over the intermediate UBM layer; the depositing or sputtering of one or more conductive pillars over the intermediate UBM layer using the photoresist layers for alignment; the removing of the photoresist layers; and then finally the etching and removing of portions of the intermediate UBM layer that were not covered by the pillars.

In contrast, the conductive pillar(s) 160 of the embodiments of the present disclosure, which may be formed using one or more electroless plating processes, may alleviate the need for an intermediate UBM layer and an alignment photoresist during the formation of the conductive pillar(s) 160. For example, using one or more electroless plating process, the conductive pillar(s) 160 may be formed directly over the interconnect pad(s) 140 without a UBM layer between the conductive pillar(s) 160 and the interconnect pad(s) 140. Further, using one or more electroless plating processes, the conductive pillar(s) 160 may be aligned with and formed over the interconnect pad(s) 140 without the need for a patterned photoresist layer to provide such alignment.

Electroless plating is an auto-catalytic chemical processing technique used to form or deposit a first metal-based material over a surface of a body or device, wherein the surface or portions of the surface comprise a second metal-based material. Electroless plating typically involves exposing and/or immersing the second metal-based surface portions of the body or device to a chemical solution comprising the first metal-based material. The chemical solution may also comprise a reducing agent which may react with metal ions of the first and second metal-based materials in order to deposit the first metal-based material over the exposed portions of the second metal-based material. The first metal-based material may deposited or formed in a conformal, uniform manner over the exposed portions of the second metal-based material of the body or device.

Accordingly, forming the conductive pillar(s) 160 using one or more electroless plating processes, as described for the present embodiments, may decrease the number of processing steps and/or materials that may be used for forming the conductive pillar(s) 160, which, in turn, may decrease the overall manufacturing cost and/or lead time for forming the conductive pillar(s) 160 as compared to previous pillar formation techniques. In various embodiments, the one or more electroless plating processes may be configured to form the conductive pillar(s) 160 of copper, aluminum, tin, nickel, palladium, platinum, combinations thereof or the like.

As illustrated in FIG. 1, the conductive pillar(s) 160 formed using the one or more electroless plating processes may have a first cross-sectional width $W_1$, which may correspond to a width of the conductive pillar(s) 160 that may be in contact with the second passivation layer 150 and the interconnect pad(s) 140. The conductive pillar(s) 160 may be in contact with the interconnect pad(s) 140 through an opening $P_{OPEN}$ in the second passivation layer 150. The conductive pillar(s) 160 may have a second cross-sectional width $W_2$, which may correspond to the width of a top surface 160a of the conductive pillar 160. The conductive pillar(s) 160 may have a height H, which may correspond to the height of the conductive pillar(s) 160 as measured between the first cross-sectional width $W_1$ and the second cross-sectional width $W_2$. The second cross-sectional width $W_2$ may be less than the first cross-sectional width $W_1$. Thus, the conductive pillar(s) 160 may have sides 160b that may slope at an angle θ between the first cross-section width $W_1$ and the second cross-sectional width $W_2$.

It is understood that the thickness of the second passivation layer 150 is exaggerated in FIG. 1 for illustrative purposes only. In various embodiments, the thickness of the second passivation layer 150 may range from approximately 0.5 μm to approximately 2.5 μm. Accordingly, the height H between the first cross-sectional width $W_1$ and the second cross-sectional width $W_2$ may more closely represent an overall height for the conductive pillar(s) 160. In various embodiments, the size of the opening $P_{OPEN}$ may range from approximately 0.5 μm to approximately 2.5 μm.

In various embodiments, a ratio of the first cross-sectional width $W_1$ to the second cross-sectional width, as represented by the term "$W_1/W_2$," may be greater than or equal to approximately 0.5 and less than approximately 1. In various embodiments, a ratio of the first cross-section width $W_1$ to the height H, as represented by the term "$W_1/H$," may be greater than or equal to approximately 1 and less than approximately 15. The ratio $W_1/H$ may be varied by adjusting the chemical composition of the electroless plating process, the material composition of the conductive pillar(s) 160, and/or the size of the opening $P_{OPEN}$ in the second passivation layer 150. In various embodiments, the angle θ at which the sides 160b of the conductive pillar(s) 160 may slope may be greater than or equal to approximately 10° and less than approximately 60°. In various embodiments, the first cross-sectional width $W_1$ may range from approximately 3 μm to approximately 300 μm. In various embodiments, the height H may range from approximately 3 μm to approximately 30 μm.

In various embodiments, the substrate 110 may be a substrate, a silicon substrate, an organic substrate, a ceramic substrate, a laminate substrate, an interposer, a packaged die or the like. In various embodiments, the first and/or second passivation layers 120, 150 may be formed of, for example, a polyimide, polybenzoxazole ("PBO"), benzocyclobutene ("BCB"), a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material. In various embodiments, the interconnect(s) 130 and/or the interconnect pad(s) 140 may be formed of copper, aluminum, gold, tungsten, alloys thereof or the like.

Figure 2:
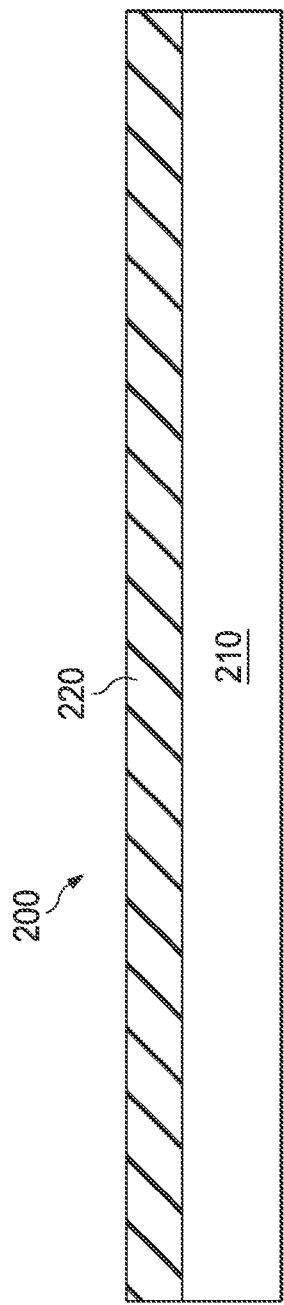
FIGS. 2-8 illustrate various intermediate stages of forming an embodiment.

FIGS. 2-8 illustrate various intermediate stages of forming an embodiment. Referring to FIG. 2, there is illustrated a device 200 having a substrate 210 having a first passivation layer 220 formed thereon. In various embodiments, the substrate 210 may be substrate, a silicon substrate, an organic substrate, a ceramic substrate, a laminate substrate, an interposer, a packaged die or the like. In various embodiments, the first passivation layer 220 may be formed using, for example, sputtering, spin coating, a plasma process, such as plasma enhanced chemical vapor deposition ("PECVD"), thermal chemical vapor deposition ("CVD"), atmospheric pressure CVD ("APCVD"), physical vapor deposition ("PVD") and the like. The first passivation layer 220 may be formed of a polyimide, PBO, BCB, a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material.

Figure 3:
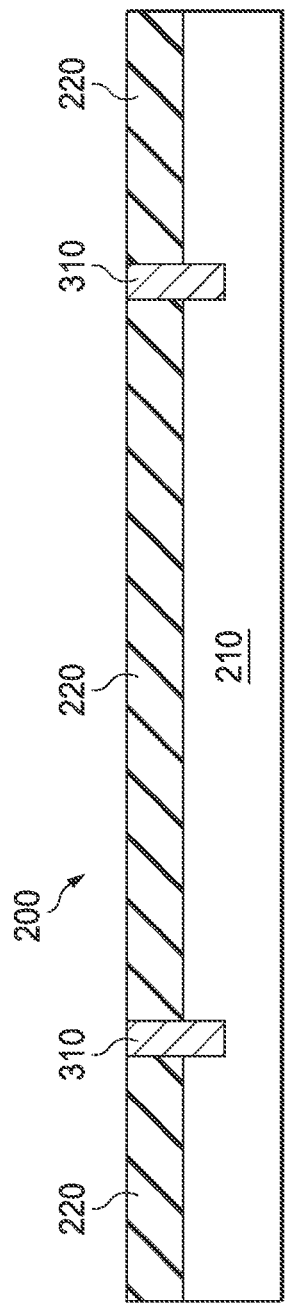

Referring to FIG. 3, one or more conductive interconnects 310 may be formed through the first passivation layer 220 and into the substrate 210. Openings (not shown) in the first passivation layer 220 and the substrate 210 may be formed using one or more etching processes, which may include dry etching, wet etching or combinations thereof, drilling processes or the like. In an embodiment, one or more photoresist layers (not shown) may be formed and patterned over the passivation layer and the openings (not shown) may be formed according to the pattern using one or more etching processes. The openings formed through the passivation layer 220 and into the substrate 210 may be filled with a conductive material using deposition, electro plating or the like to form the interconnect(s) 310. The interconnect(s) 310 may be electrically coupled to RDLs, electrical devices and/or circuits (all not shown) that may be formed within the substrate 210.

Figure 4:
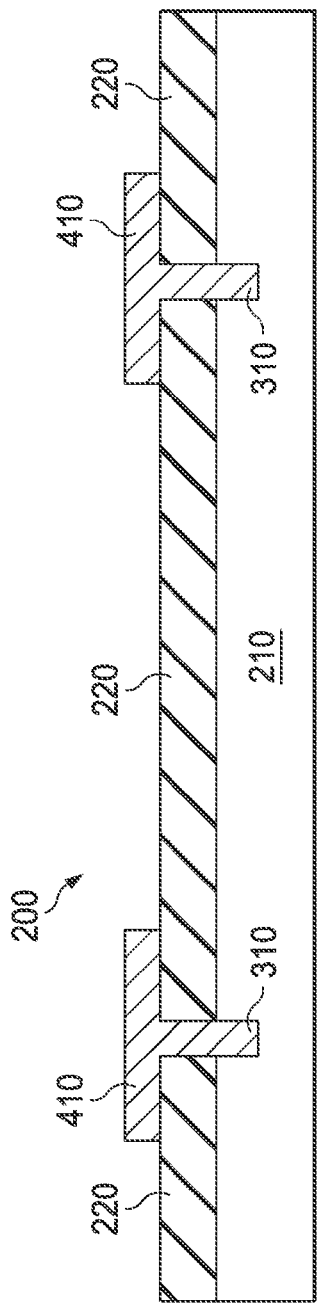

As illustrated in FIG. 4, one or more conductive interconnect pads 410 may be formed over the corresponding interconnect(s) 310. The interconnect pad(s) 410 may be formed using processes such as, for example, deposition, electro plating, or the like. In various embodiments, the interconnect(s) 310 and/or the interconnect pad(s) 410 may be formed of copper, aluminum, tin, gold, tungsten, alloys thereof or the like. In various embodiments, the interconnect(s) 310 and the interconnect pad(s) 410 may be formed of a same or a different material.

Figure 5:
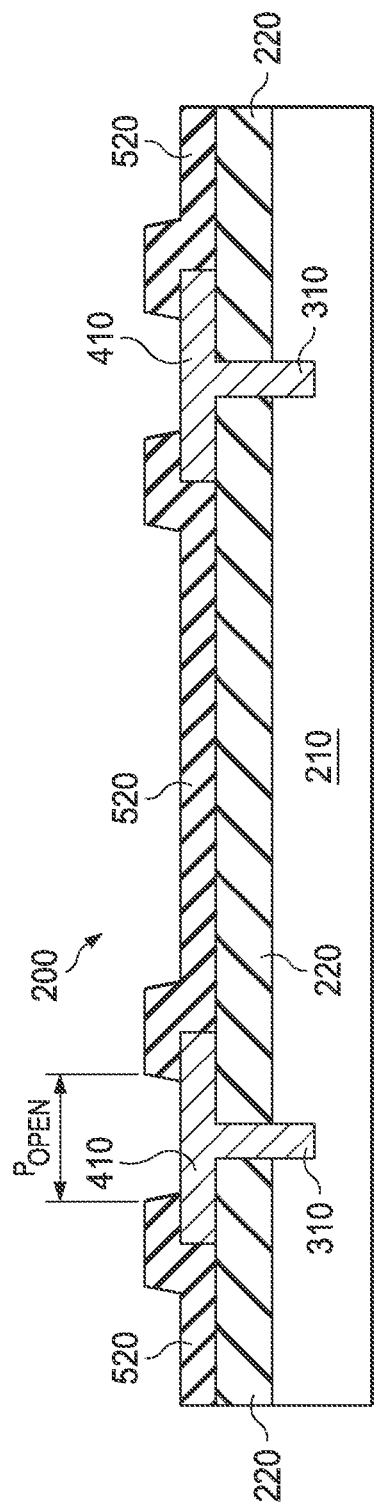

Referring to FIG. 5, a second passivation layer 520 may be formed and patterned over the first passivation layer 220 and the interconnect pad(s) 410. The second passivation layer 520 may be formed in a manner such that a portion of the interconnect pads 410 may be exposed from the second passivation layer 520 through an opening $P_{OPEN}$. In various embodiments, the second passivation layer 520 may be formed over the interconnect pad(s) 410 using processes such as, for example, sputtering, a plasma process, such as PECVD, thermal CVD, APCVD, PVD and the like. Portions of the passivation layer 520 may be removed to expose the opening(s) $P_{OPEN}$ of the interconnect pad(s) 410 using photolithography, various etching processes, which may include dry etching, wet etching and combinations thereof. Multiple treatments of forming and/or removing the second passivation layer 520 over the interconnect pad(s) 410 may be performed to expose portions of the interconnect pad(s) 410 from the second passivation layer 520. In various embodiments, the size of the opening $P_{OPEN}$ may range from approximately 0.5 μm to approximately 2.5 μm.

Figure 6:
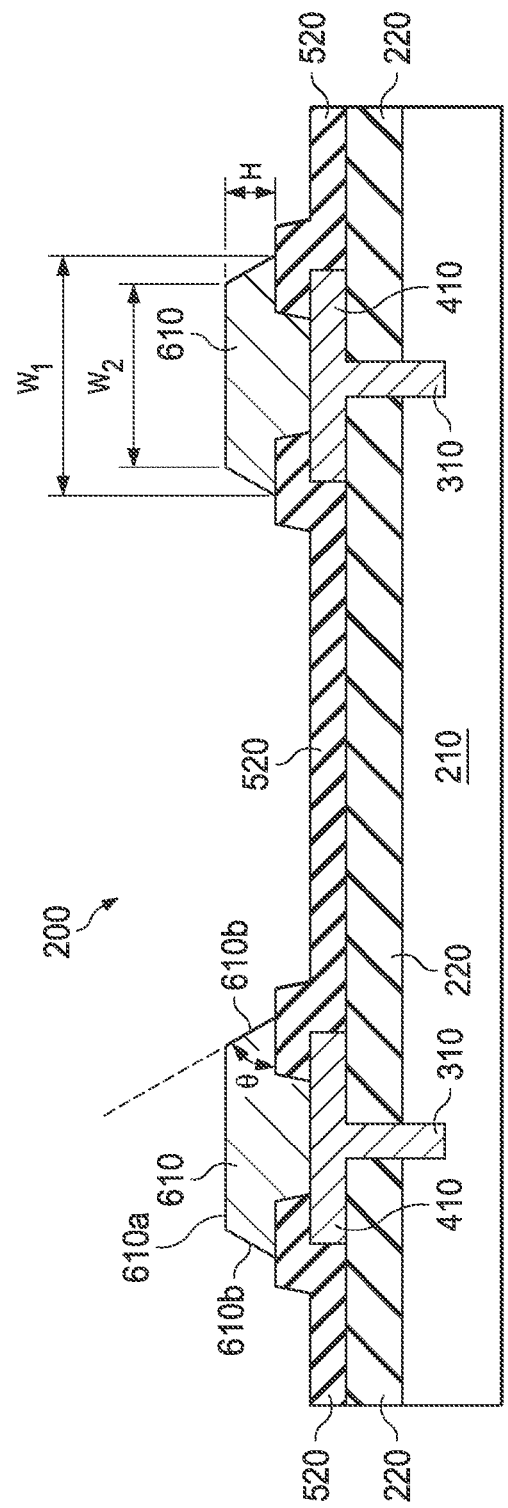

As illustrated in FIG. 6, one or more conductive pillars 610 may be formed directly over the exposed portions of the interconnect pad(s) 410 using one or more electroless plating processes. The conductive pillar(s) 610 may overlap portions of the second passivation layer 520 that may be adjacent to the exposed portions of the interconnect pad(s) 410. In various embodiments, the one or more electroless plating processes may be configured to form the conductive pillar(s) 610 of copper, aluminum, tin, nickel, palladium, titanium, platinum, combinations thereof or the like.

The conductive pillar(s) 610 formed using the one or more electroless plating processes may have a first cross-sectional width $W_1$, which may correspond to the width of the conductive pillar(s) 610 as may be formed over and contacting the second passivation layer 520. The conductive pillar(s) 610 may have a second cross-sectional width $W_2$, which may correspond to the width of a top surface(s) 610a of the conductive pillar(s) 610. The conductive pillar(s) 610 may have a height H, which may correspond to the height of the conductive pillar(s) 610 as measured between the first cross-sectional width $W_1$ and the second cross-sectional width $W_2$. The second cross-sectional width $W_2$ may be less than the first cross-sectional width $W_1$. Thus, the conductive pillar(s) 610 may have sides 610b that may slope at an angle θ as measured between the respective sides 610b and the second cross-sectional width $W_2$.

In various embodiments, a ratio of $W_1/W_2$ may be greater than or equal to approximately 0.5 and less than approximately 1. In various embodiments, a ratio of $W_1/H$ may be greater than or equal to approximately 1 and less than approximately 15. In various embodiments, the angle θ at which the sides 610b of the conductive pillar 610 may slope may be greater than or equal to approximately 10° and less than approximately 60°.

Figure 7:
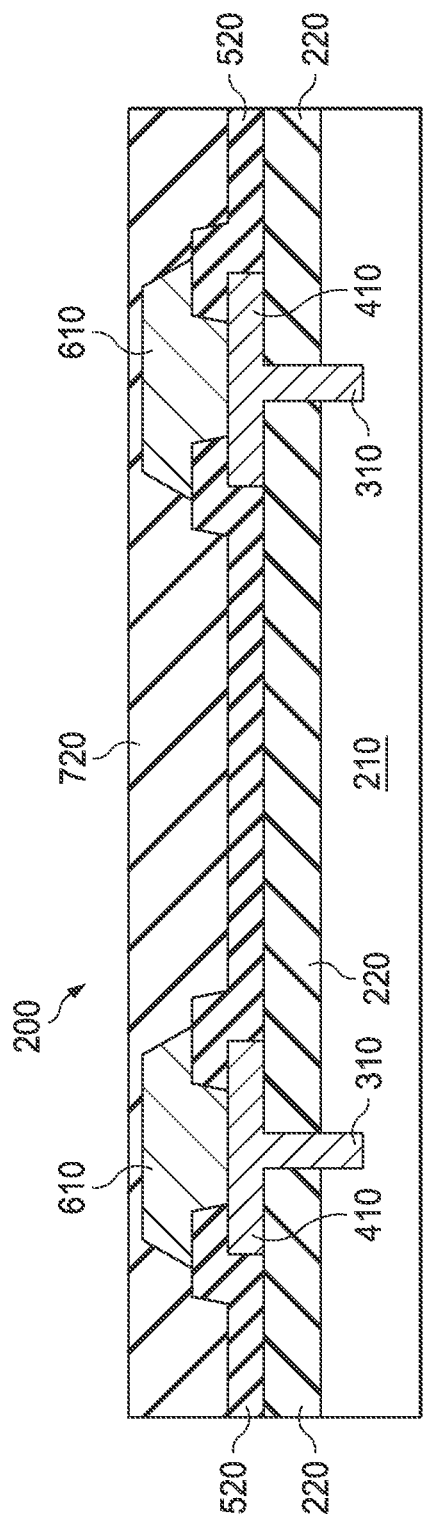

In an embodiment, as shown in FIG. 7, a third passivation layer 720 may be formed over the second passivation layer 520 and the conductive pillar(s) 610. In various embodiments, the third passivation layer 720 may be formed using processes such as, for example, sputtering, a plasma process, such as PECVD, thermal CVD, APCVD, PVD and the like. In various embodiments, the third passivation layer 720 may be formed of a polyimide, PBO, BCB, a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material.

Figure 8:
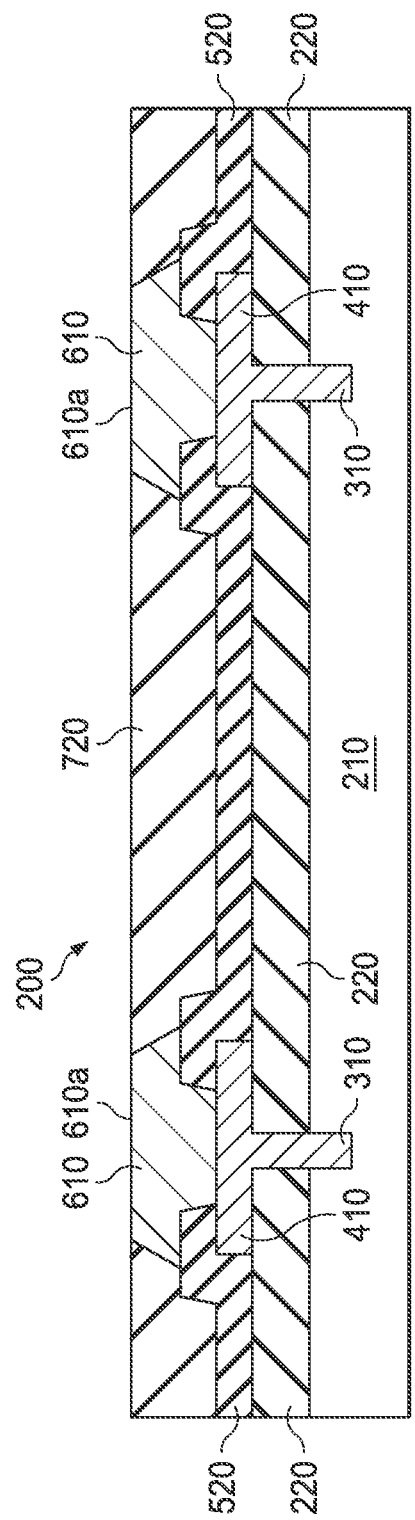

As shown in FIG. 8, the third passivation layer 720 may be thinned to expose the top surface(s) 610a of the corresponding conductive pillar(s) 610. In various embodiments, the third passivation layer 720 may be thinned using a grinding or polishing process, such as, for example, chemical mechanical polishing ("CMP"). After exposing the top surface(s) 610 of the conductive pillar(s) 610, the device 200 may have formed thereon, for example, RDL layers, conductive bumps, dies or interposers. In an example where the device 200 may be formed on a substrate (not shown) that may include other devices (not shown), the device 200 may be singulated from the substrate for further processing or mounting within a semiconductor package (not shown). In various embodiments, the device 200 may be used in 3D IC fan-in or 3D IC fan-out packages (not shown).

In an embodiment, a method is provided. The method may comprise forming an interconnect through a first passivation layer; forming an interconnect pad over the interconnect structure and a portion of the first passivation layer; forming a second passivation layer over the interconnect pad and the first passivation layer, wherein a portion of the interconnect pad remains exposed after the forming the second passivation layer; and forming a conductive pillar directly over the exposed portion of the interconnect pad using a catalytic an auto-catalytic chemical plating process, wherein sides of the conductive pillar extend over portions of the second passivation layer adjacent to the exposed portion of the interconnect pad.

In another embodiment, another method is provided. The method may comprise forming a conductive pillar directly over an exposed portion of the interconnect pad using an electroless plating process, wherein the conductive pillar is formed having a first width and a second width and wherein the first width is different from the second width; forming a passivation layer over the conductive pillar; and removing a portion of the passivation layer to expose a first surface of the conductive pillar.

In another embodiment, a device is provided. The device may comprise a substrate; a first passivation layer formed on the substrate; a first interconnect extending through the first passivation layer and into the substrate; a first interconnect pad electrically coupled to the first interconnect; a second passivation layer formed over portions of the first passivation layer and over portions of the first interconnect pad; and a conductive pillar electrically coupled to the first interconnect pad and the first interconnect, the conductive pillar having a first width, a second width and a first height corresponding to a distance between the first width and the second width, wherein the first width is different from than the second width.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming an interconnect structure through a first passivation layer;
    forming an interconnect pad over the interconnect structure and a portion of the first passivation layer;
    forming a second passivation layer over the interconnect pad and the first passivation layer, wherein a portion of the interconnect pad remains exposed after the forming the second passivation layer; and
    forming a conductive pillar directly over the exposed portion of the interconnect pad using an auto-catalytic chemical processing technique, the conductive pillar having a first width proximate the second passivation layer and a second width distal the second passivation layer, the first width being greater than the second width.

2. The method of claim 1, wherein sides of the conductive pillar extend over portions of the second passivation layer adjacent to the exposed portion of the interconnect pad.

3. The method of claim 1, wherein the auto-catalytic chemical processing technique includes electroless plating.

4. The method of claim 1, wherein forming a conductive pillar includes conformally plating the conductive pillar on the interconnect pad and the second passivation layer.

5. The method of claim 1, wherein the interconnect pad is a single material extending from a topmost surface of the interconnect structure to a topmost surface of the first passivation layer.

6. The method of claim 1, wherein sides of the conductive pillar slope at an angle greater than or equal to 10° and less than 60° between the first width and the second width.

7. The method of claim 1, wherein the conductive pillar is formed to a first height corresponding to a distance between the first width and the second width for the portion of the conductive pillar extending over the second passivation layer and wherein a ratio of the first width to the first height is greater than or equal to approximately 1 and less than approximately 15.

8. The method of claim 1, wherein the first width ranges from about 3 μm to about 300 μm, and the first height ranges from about 3 μm to about 30 μm.

9. The method of claim 1, wherein the exposed portion of the interconnect pad has a width from about 0.5 μm to about 2.5 μm.

10. A method comprising:
depositing a first passivation layer over a substrate;
forming a first conductive feature having a first portion extending through the first passivation layer and a second portion extending over the first passivation layer;
depositing a second passivation layer over a periphery of the second portion of the first conductive feature;
electroless plating a second conductive feature directly onto the second portion of the first conductive feature;
forming a third passivation layer over the second passivation layer and the second conductive feature; and
removing a portion of the third passivation layer to expose a first surface of the second conductive feature.

11. The method of claim 10, wherein sides of the second conductive feature extend over portions of the second passivation layer.

12. The method of claim 10, wherein sides of the second conductive feature slope at an angle greater than or equal to 10° and less than 60° relative a major surface of the second passivation layer.

13. The method of claim 10, wherein the second conductive feature is made of copper, aluminum, tin, palladium, titanium, platinum or combinations thereof.

14. The method of claim 10, wherein the first passivation layer is made of a polyimide, PBO, BCB, a non-photosensitive polymer or combinations thereof.

15. The method of claim 10, wherein the second conductive feature is formed having a first width proximate the second passivation layer and a second width distal the second passivation layer, and wherein the first width is greater than the second width.

16. The method of claim 15, wherein the second conductive feature is formed to a first height corresponding to a distance between the first width and the second width for the portion of the second conductive feature extending over the second passivation layer and wherein a ratio of the first width to the first height is greater than or equal to approximately 1 and less than approximately 15.

17. A device comprising:
a substrate;
a first passivation layer formed on the substrate;
a first interconnect extending through the first passivation layer;
a first interconnect pad electrically coupled to the first interconnect, the first interconnect pad being a single metal structure extending from the first interconnect to a topmost surface;
a second passivation layer formed over portions of the first passivation layer and over portions of the first interconnect pad, the second passivation layer having an opening extending therethrough exposing a portion of the topmost surface of the first interconnect pad; and
a conductive pillar, the conductive pillar having a first width in the opening in the second passivation layer and physically contacting the topmost surface of the first interconnect pad, the conductive pillar further having a second width extending over the second passivation layer and having a sidewall forming an acute angle relative a topmost surface of the second passivation layer.

18. The device of claim 17, wherein the acute angle is between about ten degrees to about sixty degrees.

19. The device of claim 17, further comprising a third passivation layer over the second passivation layer and having an opening therein exposing a first surface of the conductive pillar.

20. The device of claim 17, wherein the conductive pillar is formed to a first height corresponding to a distance between the first width and the second width for the portion of the conductive pillar extending over the second passivation layer and wherein a ratio of the first width to the first height is greater than or equal to approximately 1 and less than approximately 15.

* * * * *